United States Patent
Dokai et al.

(10) Patent No.: US 8,944,335 B2
(45) Date of Patent: Feb. 3, 2015

(54) WIRELESS IC DEVICE

(71) Applicant: Murata Manufacturing Co., Ltd., Nagaokakyo-shi, Kyoto-fu (JP)

(72) Inventors: Yuya Dokai, Nagaokakyo (JP); Masahiro Ozawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 125 days.

(21) Appl. No.: 13/738,143

(22) Filed: Jan. 10, 2013

(65) Prior Publication Data

US 2013/0140369 A1   Jun. 6, 2013

Related U.S. Application Data

(63) Continuation of application No. PCT/JP2011/071795, filed on Sep. 26, 2011.

(30) Foreign Application Priority Data

Sep. 30, 2010   (JP) ................................ 2010-220973

(51) Int. Cl.
*G06K 19/06* (2006.01)
*G06K 19/07* (2006.01)
*H01Q 1/22* (2006.01)
(Continued)

(52) U.S. Cl.
CPC .......... *G06K 19/0723* (2013.01); *H01Q 1/2208* (2013.01); *H01Q 1/38* (2013.01); *H01Q 7/00* (2013.01); *H05K 1/182* (2013.01); *H01Q 21/30* (2013.01); *H01L 23/66* (2013.01); *H01L 2223/6677* (2013.01);
(Continued)

(58) Field of Classification Search
USPC ......................................................... 235/492
See application file for complete search history.

(56) References Cited

U.S. PATENT DOCUMENTS 3,364,564 A    1/1968   Kurtz et al.
4,794,397 A    12/1988  Ohe et al.
(Continued)

FOREIGN PATENT DOCUMENTS

CA         2 279 176 A1    7/1998
DE   10 2006 057 369 A1    6/2008
(Continued)

OTHER PUBLICATIONS

Official Communication issued in International Patent Application No. PCT/JP2010/066291, mailed on Dec. 28, 2010.
(Continued)

*Primary Examiner* — Michael G Lee
*Assistant Examiner* — David Tardif
(74) *Attorney, Agent, or Firm* — Keating & Bennett, LLP

(57) ABSTRACT

A wireless IC device that improves radiation gain without increasing substrate size and easily adjusts impedance, includes a multilayer substrate including laminated base layers. On a side of an upper or first main surface of the multilayer substrate, a wireless IC element is arranged to process a high-frequency signal. On a side of a lower or second main surface of the multilayer substrate, a first radiator is provided and is coupled to the wireless IC element via a feeding circuit including first interlayer conductors. On the side of the first main surface, a second radiator is provided and is coupled to the first radiator via second interlayer conductors.

20 Claims, 12 Drawing Sheets

(51) Int. Cl.
*H01Q 1/38* (2006.01)
*H01Q 7/00* (2006.01)
*H05K 1/18* (2006.01)
*H01Q 21/30* (2006.01)
*H01L 23/66* (2006.01)

(52) U.S. Cl.
CPC .................. *H01L 2924/0002* (2013.01); *H01L 2924/15311* (2013.01); *H01L 2924/19105* (2013.01)
USPC ........................................................ 235/492

(56) References Cited

U.S. PATENT DOCUMENTS

| | | |
|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0285335 A1 | 12/2007 | Bungo et al. |
| 2007/0290326 A1* | 12/2007 | Yang et al. ............ 257/697 |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0087990 A1 | 4/2008 | Kato et al. |
| 2008/0129606 A1 | 6/2008 | Yanagisawa et al. |
| 2008/0143630 A1 | 6/2008 | Kato et al. |
| 2008/0149731 A1* | 6/2008 | Arai et al. ............ 235/492 |
| 2008/0169905 A1 | 7/2008 | Slatter |
| 2008/0184281 A1 | 7/2008 | Ashizaki et al. |
| 2008/0272885 A1 | 11/2008 | Atherton |
| 2009/0002130 A1 | 1/2009 | Kato |
| 2009/0002229 A1* | 1/2009 | Noro et al. ............ 342/357.12 |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1* | 3/2009 | Kato et al. ............ 235/492 |
| 2009/0096696 A1 | 4/2009 | Joyce, Jr. et al. |
| 2009/0109034 A1* | 4/2009 | Chen et al. ............ 340/572.7 |
| 2009/0109102 A1* | 4/2009 | Dokai et al. ............ 343/702 |
| 2009/0140947 A1 | 6/2009 | Sasagawa et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |

(56) References Cited

U.S. PATENT DOCUMENTS

| | | |
|---|---|---|
| 2009/0278687 A1 | 11/2009 | Kato |
| 2009/0284220 A1 | 11/2009 | Toncich et al. |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |
| 2011/0063184 A1 | 3/2011 | Furumura et al. |
| 2011/0186641 A1 | 8/2011 | Kato et al. |
| 2011/0253795 A1 | 10/2011 | Kato |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 09-093029 A | 4/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-69533 A | 3/1998 |
| JP | 10-069533 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |

(56) References Cited

FOREIGN PATENT DOCUMENTS

| | | |
|---|---|---|
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-163134 A | 6/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-033461 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |

(56) References Cited

FOREIGN PATENT DOCUMENTS

| | | |
|---|---|---|
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-013976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-13120 A | 1/2007 |
| JP | 2007-013120 A | 1/2007 |
| JP | 2007-18067 A | 1/2007 |
| JP | 2007-019905 A | 1/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-524942 A | 8/2007 |
| JP | 2007-228254 A | 9/2007 |
| JP | 2007-228325 A | 9/2007 |
| JP | 2007-233597 A | 9/2007 |
| JP | 2007-241789 A | 9/2007 |
| JP | 2007-266999 A | 10/2007 |
| JP | 2007-272264 A | 10/2007 |
| JP | 2007-287128 A | 11/2007 |
| JP | 2007-295177 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-27291 A | 2/2009 |
| JP | 2009-027291 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |
| JP | 2009-111986 A | 5/2009 |
| JP | 2009-135166 A | 6/2009 |
| JP | 2009-153166 A | 7/2009 |
| JP | 2009-182630 A | 8/2009 |
| JP | 2009-213169 A | 9/2009 |
| JP | 2009-260758 A | 11/2009 |
| JP | 2009-284182 A | 12/2009 |
| JP | 2010-009196 A | 1/2010 |
| JP | 2010-050844 A | 3/2010 |
| JP | 2010-081571 | 4/2010 |

(56) References Cited

FOREIGN PATENT DOCUMENTS

| | | |
|---|---|---|
| JP | 4609604 B2 | 1/2011 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |

OTHER PUBLICATIONS

Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.
Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.

(56) References Cited

OTHER PUBLICATIONS

Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2011/068110, mailed on Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System", U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, mailed on Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.

Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
ITO: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official communication issued in counterpart International Application No. PCT/JP2008/071502, mailed Feb. 24, 2009.
Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official Communication issued in International Patent Application No. PCT/JP2008/063025, mailed on Aug. 12, 2008.
Kato et al.: "Wireless IC Device,"; U.S. Appl. No. 12/603,608, filed Oct. 22, 2009.
Kato et al.: "Wireless IC Device,"; U.S. Appl. No. 12/688,072, filed Jan. 15, 2010.
Official Communication issued in International Patent Application No. PCT/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP2009/053690, mailed on Jun. 2, 2009.

(56) References Cited

OTHER PUBLICATIONS

Kato et al.: "Radio Frequency IC Device and Radio Communication System,"; U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official Communication issued in International Application No. PCT/JP2008/050356, mailed on Mar. 25, 2008.
Osamura et al.: "Packaging Material With Electromagnetic Coupling Module,"; U.S. Appl. No. 12/536,663, filed Aug. 6, 2009.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.

* cited by examiner

WIRELESS IC DEVICE

BACKGROUND OF THE INVENTION

1. Field of the Invention

The present invention relates to a wireless IC device, particularly to a wireless IC device preferably for use in an RFID (Radio Frequency Identification) system.

2. Description of the Related Art

In recent years, as an article information management system, an RFID system that has been in practical use performs non-contact communication using an electromagnetic field and transmits predetermined information between a reader-writer which generates an induced magnetic field and an RFID tag attached to an article. This RFID tag includes a wireless IC chip which stores predetermined information and processes a predetermined high-frequency signal and an antenna (radiator) which transmits and receives a high-frequency signal.

The RFID system is in some cases used in information management of a printed wiring board included in various electronic devices. As this type of printed wiring board, those described in Japanese Unexamined Patent Application Publication No. 11-515094 and Japanese Unexamined Patent Application Publication No. 2009-153166 are known.

In the printed wiring board described in Japanese Unexamined Patent Application Publication No. 11-515094, an RFID element which processes a radio signal is mounted on a surface of a multilayer substrate, and an antenna pattern serving as a radiating element is formed on the surface and in internal layers. In this printed wiring board, the size of the antenna pattern needs to be increased to improve the gain of the antenna. The increase in size of the antenna pattern, however, causes an increase in size of the printed wiring board itself.

Meanwhile, the printed wiring board described in Japanese Unexamined Patent Application Publication No. 2009-153166 uses a loop-shaped electrode to cause an electrode functioning as a ground of the printed wiring board to also function as a radiating element. It is therefore possible to improve the gain without causing an increase in size of the printed wiring board. Generally, however, various mounted components, such as a semiconductor IC chip and a chip capacitor, are mounted on a surface layer of the printed wiring board. Due to the influence of these mounted components, therefore, particularly a radiation gain toward the surface layer fails to be sufficiently obtained in some cases.

SUMMARY OF THE INVENTION

In view of the above, preferred embodiments of the present invention provide a wireless IC device that improves radiation gain without increasing substrate size and also enables easily adjustment of impedance.

A wireless IC device according to a preferred embodiment of the present invention includes a substrate including a first main surface and a second main surface facing the first main surface; a wireless IC element provided on the side of the first main surface and configured to process a high-frequency signal; a first radiator provided on the side of the second main surface and coupled to the wireless IC element via a feeding circuit including first interlayer conductors; and a second radiator provided on the side of the first main surface and coupled to the first radiator via second interlayer conductors.

In the wireless IC device according to a preferred embodiment of the present invention, the wireless IC element is coupled to the first radiator via the feeding circuit including the first interlayer conductors, and is coupled to the second radiator via the first radiator and the second interlayer conductors. Therefore, high-frequency energy is efficiently supplied from the wireless IC element to the first and second radiators, and the gain of a high-frequency signal radiated from the first and second radiators is increased. Further, the first radiator is provided on the side of the second main surface of the substrate, and the second radiator is provided on the side of the first main surface of the substrate. Even if a surface layer of the wireless IC device includes components mounted thereon, therefore, it is possible to significantly reduce and prevent a reduction in radiation gain toward the surface layer, and the radiation gain is consequently improved. Particularly, the wireless IC element is preferably provided on the side of the first main surface of the substrate, and is coupled to the first radiator disposed on the second main surface. It is therefore possible to provide a relatively large area for arranging the feeding circuit, which is preferably located between the wireless IC element and the first radiator, without an increase in substrate area, and to achieve high impedance. Accordingly, it is easy to adjust the impedance of the feeding circuit.

Further, since the area in which the feeding circuit is provided is relatively large, it is possible, in a case in which the feeding circuit has a loop shape, to increase a magnetic flux passing through a loop, and the radiation gain is improved. Further, if the first interlayer conductors, the first radiator, the second interlayer conductors, and the second radiator are loop-shaped, a magnetic flux also passes through a loop defined by these conductors, and the radiation gain is further improved.

According to a preferred embodiment of the present invention, a wireless IC device that improves the radiation gain without increasing substrate size and that easily adjusts the impedance is obtainable, and is favorably usable in an RFID system.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A and 3B illustrate the wireless IC device according to the first preferred embodiment of the present invention, wherein FIG. 3A is a cross-sectional view along an X-X line in FIG. 2, and FIG. 3B is a cross-sectional view along a Y-Y line in FIG. 2.

FIGS. 12A and 12B illustrate a wireless IC device according to a fifth preferred embodiment of the present invention, wherein FIG. 12A is an exploded perspective view and FIG. 12B is a plan view.

DETAILED DESCRIPTION OF THE PREFERRED EMBODIMENTS

Figure 1:
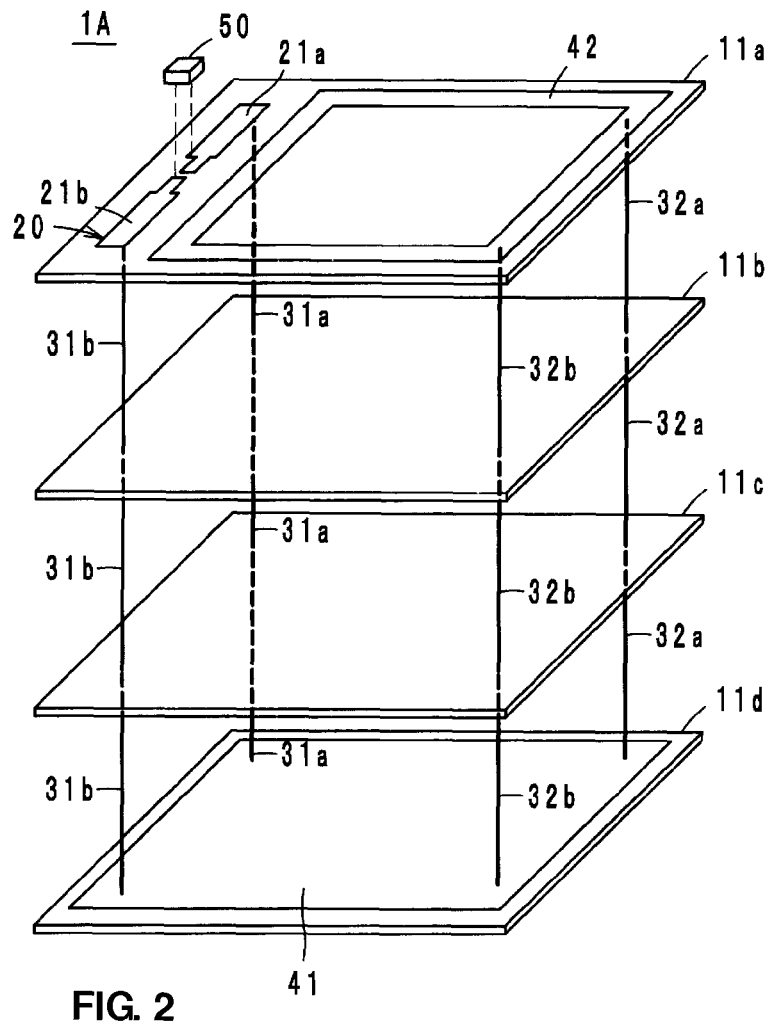
FIG. 1 is an exploded perspective view illustrating a wireless IC device according to a first preferred embodiment of the present invention.
Figure 2:
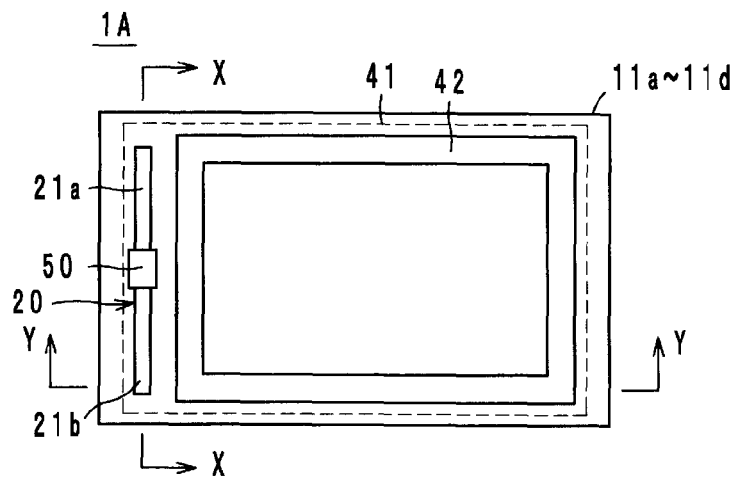
FIG. 2 is a plan view illustrating the wireless IC device according to the first preferred embodiment of the present invention.

Preferred embodiments of a wireless IC device according to the present invention will be described below with reference to the accompanying drawings. In the drawings, common components or elements will be designated by the same reference signs, and redundant description will be omitted.
First Preferred Embodiment As illustrated in FIGS. 1 and 2, a wireless IC device 1A according to a first preferred embodiment of the present invention includes a multilayer substrate including base layers 11a, 11b, 11c, and 11d laminated on each other. The upper surface and the lower surface of the multilayer substrate will be referred to as the first main surface and the second main surface, respectively. On the side of the first main surface of the multilayer substrate, a wireless IC element 50 is provided and is arranged to process a high-frequency signal. On the side of the second main surface, a first radiator 41 is provided which is coupled to the wireless IC element 50 via a feeding circuit 20 including first interlayer conductors 31a and 31b. Further, on the side of the first main surface, a second radiator 42 is provided and is coupled to the first radiator 41 via second interlayer conductors 32a and 32b.

The wireless IC element 50, which processes a high-frequency signal, will be described in detail below with reference to FIGS. 5 to 8. The first and second radiators 41 and 42 preferably function as antennas, as described below, but may function as ground electrodes of electronic components mounted on the multilayer substrate (see FIG. 17), for example.

The base layers 11a to 11d are preferably made of a well-known glass epoxy material, for example. On one side portion of the base layer 11a, feeding conductors 21a and 21b are arranged with respective first ends thereof electrically connected to not-illustrated first and second terminal electrodes of the wireless IC element 50. That is, the respective first ends of the feeding conductors 21a and 21b preferably function as feeding terminals. The first radiator 41 is arranged over substantially the entire surface of the base layer 11d, and preferably is direct-current-coupled by the first interlayer conductors (via-hole conductors) 31a and 31b passing through the base layers 11b and 11c to realize DC paths.

Figure 3A:
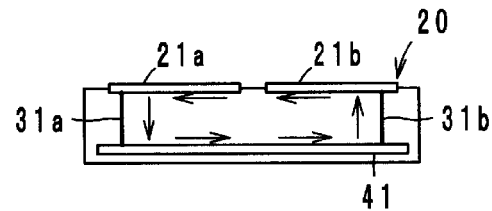

As illustrated in a cross-sectional view in FIG. 3A, the feeding conductors 21a and 21b, the first interlayer conductors 31a and 31b, and one side portion of the first radiator 41 define the loop-shaped feeding circuit 20. Further, the second radiator 42 preferably is loop-shaped in a plan view over substantially the entire surface of the remaining area of the base layer 11a excluding the area provided with the feeding conductors 21a and 21b. The second radiator 42 preferably is direct-current-coupled by the second interlayer conductors (via-hole conductors) 32a and 32b passing through the base layers 11b and 11c in another side portion of the multilayer substrate.

Figure 4:
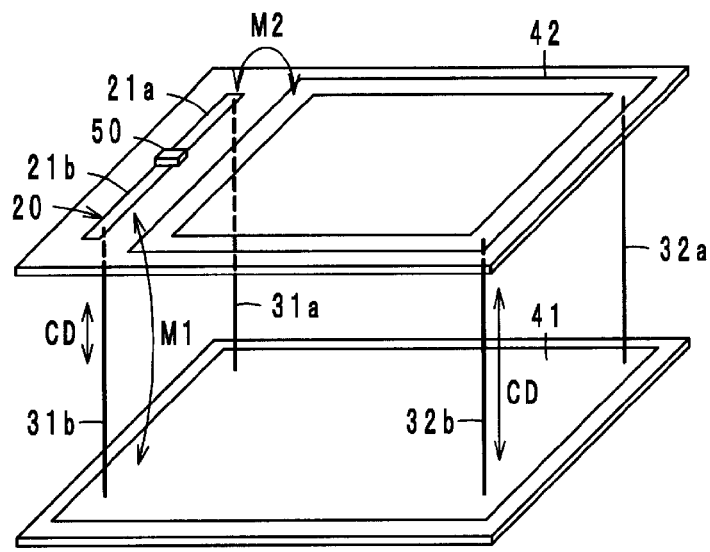
FIG. 4 is a perspective view illustrating a coupled state in the wireless IC device according to the first preferred embodiment of the present invention.

As illustrated in FIG. 4, the loop-shaped feeding circuit 20 preferably is direct-current-coupled (DC-coupled) and electromagnetic field coupled (M1) to the first radiator 41. Further, the loop-shaped feeding circuit 20 preferably is also electromagnetic field coupled (M2) to the second radiator 42 in an area in which the feeding circuit 20 and the second radiator are proximate to each other. Herein, electromagnetic field coupling includes an electric field coupling and/or a magnetic field coupling. With the loop-shaped feeding circuit 20 and the first radiator 41 electrically connected (direct-current-coupled), it is possible to improve the transmission efficiency of the high-frequency signal.

Figure 3B:
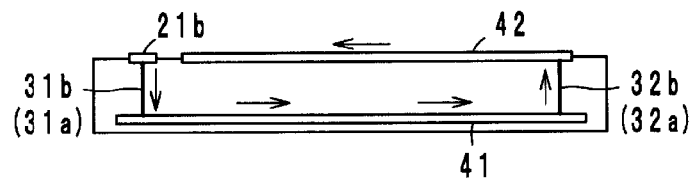

As illustrated in FIG. 3B, in a cross-sectional view of the wireless IC device 1A along a Y-Y line, the first interlayer conductor 31b (31a), the first radiator 41, the second interlayer conductor 32b (32a), and the second radiator 42 also define a loop-shaped conductor pattern.

In the wireless IC device 1A having the above-described configuration, the loop-shaped feeding circuit 20 is coupled to the first and second radiators 41 and 42. Accordingly, a high-frequency signal radiated from a reader-writer of an RFID system and received by the first and second radiators 41 and 42 is supplied to the wireless IC element 50 via the feeding circuit 20, and the wireless IC element 50 operates. Meanwhile, a response signal from the wireless IC element 50 is transmitted to the first and second radiators 41 and 42 via the feeding circuit 20, and is radiated to the reader-writer.

More specifically, the feeding circuit 20 and the first radiator 41 preferably are direct-current-coupled and electromagnetic field coupled (M1) in one side region of the first radiator 41. Further, the second radiator 42 preferably is direct-current-coupled to the first radiator 41 via the second interlayer conductors 32a and 32b, and is electromagnetic field coupled (M2) to the feeding circuit 20. That is, high-frequency power supplied from the wireless IC element 50 is supplied to the first radiator 41 via the feeding circuit 20 in direct current form and through an electromagnetic field. The high-frequency power is supplied in direct current form to the second radiator 42 via the feeding circuit 20, the first radiator 41, and the second interlayer conductors 32a and 32b, and is also supplied to the second radiator 42 via the feeding circuit 20 through an electromagnetic field. Therefore, high-frequency energy is efficiently supplied from the wireless IC element 50 to the first and second radiators 41 and 42, and the gain of the high-frequency signal radiated from the first and second radiators 41 and 42 is increased.

Further, in the wireless IC device 1A, preferably, the first radiator 41 is provided on the side of the second main surface of the multilayer substrate, and the second radiator 42 is provided on the side of the first main surface of the multilayer substrate. Even if a surface layer of the wireless IC device 1A is mounted with a mounted component, therefore, it is possible to significantly reduce and prevent a reduction in radiation gain toward the surface layer, and the radiation gain is consequently improved. Particularly, the wireless IC element 50 preferably is provided on the side of the first main surface of the multilayer substrate, and is coupled to the first radiator disposed on the side of the second main surface. It is therefore possible to provide a relatively large area to arrange the feeding circuit 20, which is preferably located between the wireless IC element 50 and the first radiator 41, without an increase in substrate area, and to achieve high impedance. Accordingly, it is easy to adjust the impedance of the feeding circuit 20.

Further, since the area in which the feeding circuit 20 is arranged is relatively large, it is possible, in a case in which the feeding circuit 20 is loop-shaped, to increase a magnetic flux passing through a loop, and the radiation gain is improved. Further, with the first interlayer conductors 31a and 31b, the first radiator 41, the second interlayer conductors 32a and 32b, and the second radiator 42 being arranged in a loop shape (see FIG. 3B), a magnetic flux also passes through a loop defined by these conductors, and the radiation gain is further improved. Particularly, with the second radiator 42 arranged into a loop shape in a plan view, a magnetic field is also easily provided via the loop-shaped pattern, and the radiation gain is improved.

The feeding circuit 20 preferably functions as an impedance matching circuit by coupling the wireless IC element 50 and the first radiator 41, and preferably functions as an impedance matching circuit by coupling the wireless IC element 50 and the second radiator 42. The feeding circuit 20 is capable of matching impedances in accordance with the adjustment of the electrical length thereof and the width of the feeding conductors 21a and 21b.

Particularly, the loop-shaped feeding circuit 20 includes a loop surface arranged substantially perpendicular to the first radiator 41 and the second radiator 42. It is therefore possible to dispose the feeding circuit 20 without increasing the area of the multilayer substrate, and to couple the loop-shaped feeding circuit 20 to the first radiator 41 and the second radiator 42 with a high degree of coupling.

In the first preferred embodiment of the present invention, the wireless IC element 50 is not required to be provided on the first main surface of the multilayer substrate, and may be provided to an internal layer of the multilayer substrate, as long as the wireless IC element 50 is located closer to the first main surface than the first radiator 41 is. Similarly, the first radiator 41 is not required to be provided to the second main surface of the multilayer substrate, and may be provided to an internal layer of the multilayer substrate, as long as the first radiator 41 is located closer to the second main surface than the wireless IC element 50 is. That is, in the first preferred embodiment, the first radiator 41 is provided on the inner side of the base layer 11d. Further, the second radiator 42 is not required to be provided to the first main surface of the multilayer substrate, and may be provided to an internal layer of the multilayer substrate. That is, it suffices if the second radiator 42 is provided closer to the first main surface than the first radiator 41 is.

Further, a ground electrode provided on the side of the second main surface of the wireless IC device 1A may be used as the first radiator 41, and a ground electrode provided on the side of the first main surface of the wireless IC device 1A may be used as the second radiator 42, for example. With this configuration, there is no need to separately form the radiators 41 and 42.

Figure 5:
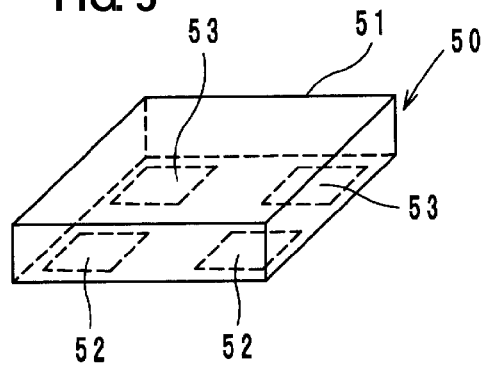
FIG. 5 is a perspective view illustrating a wireless IC chip that defines a wireless IC element.
Figure 6:
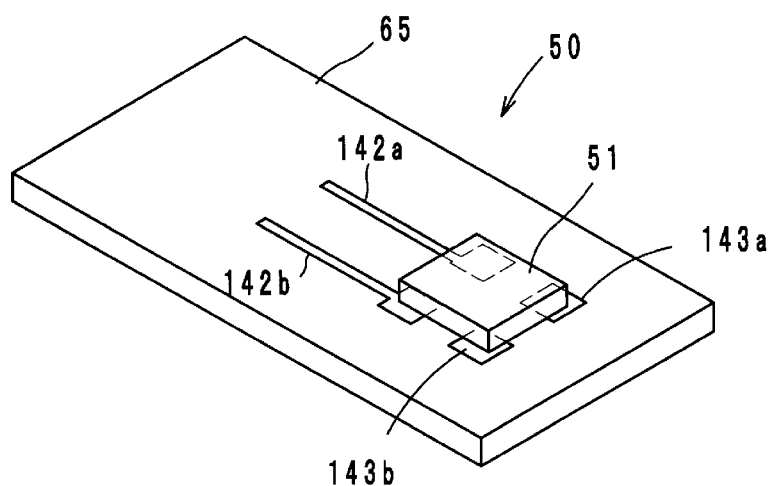
FIG. 6 is a perspective view illustrating a state in which the wireless IC chip is mounted on a feeding circuit substrate to define a wireless IC element.
Figure 7:
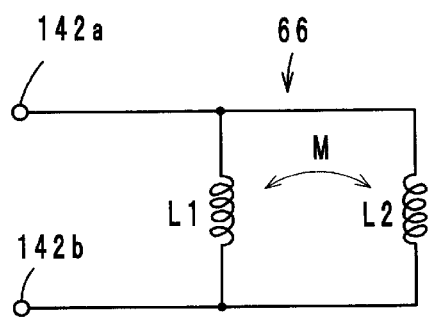
FIG. 7 is an equivalent circuit diagram illustrating an example of a feeding circuit.

The wireless IC element 50 may be a wireless IC chip 51 which processes a high-frequency signal, as illustrated in FIG. 5, or may be formed by the wireless IC chip 51 and a feeding circuit substrate 65 including a resonant circuit having a predetermined resonant frequency, as illustrated in FIG. 6, for example.

The wireless IC chip 51 illustrated in FIG. 5 preferably includes a clock circuit, a logic circuit, a memory circuit, and so forth, and stores necessary information. The wireless IC chip 51 includes a rear surface provided with input-output terminal electrodes 52 and mounting terminal electrodes 53. The input-output terminal electrodes 52 correspond to the first and second terminal electrodes described in the first preferred embodiment, and are electrically connected to the feeding conductors 21a and 21b via metal bumps or other suitable connection elements. As the material of the metal bumps, Au, solder, or other suitable material may preferably be used.

As illustrated in FIG. 6, in a case where the wireless IC chip 51 and the feeding circuit substrate 65 define the wireless IC element 50, the feeding circuit substrate 65 may be provided with various feeding circuits (including a resonant circuit/matching circuit). For example, as illustrated as an equivalent circuit in FIG. 7, the feeding circuits may include a feeding circuit 66 which includes inductance elements L1 and L2 having mutually different inductance values and magnetically coupled in mutually opposite phases (indicated as mutual inductance M). The feeding circuit 66 has a predetermined resonant frequency, and performs impedance matching between the impedance of the wireless IC chip 51 and the impedance of each of the first and second radiators 41 and 42. The wireless IC chip and the feeding circuit 66 may be electrically connected (direct-current-connected), or may be coupled via an electromagnetic field, for example.

The feeding circuit 66 transmits a high-frequency signal having a predetermined frequency and emitted from the wireless IC chip 51 to the first and second radiators 41 and 42 via the feeding circuit 20, and supplies a high-frequency signal received by the first and second radiators 41 and 42 to the wireless IC chip 51 via the feeding circuit 20. Since the feeding circuit 66 has a predetermined resonant frequency, the impedance matching with the first and second radiators 41 and 42 is easily performed, and it is possible to reduce the electrical length of the feeding circuit 20. Further, the degree of dependence of communication characteristics on the material, size, and so forth of the first and second radiators 41 and 42 is reduced.

Subsequently, a configuration of the feeding circuit substrate 65 will be described. As illustrated in FIGS. 5 and 6, the input-output terminal electrodes 52 and the mounting terminal electrodes 53 of the wireless IC chip 51 are connected via metal bumps or the like to feeding terminal electrodes 142a and 142b and mounting terminal electrodes 143a and 143b, respectively, which are provided on the feeding circuit substrate 65.

Figure 8:
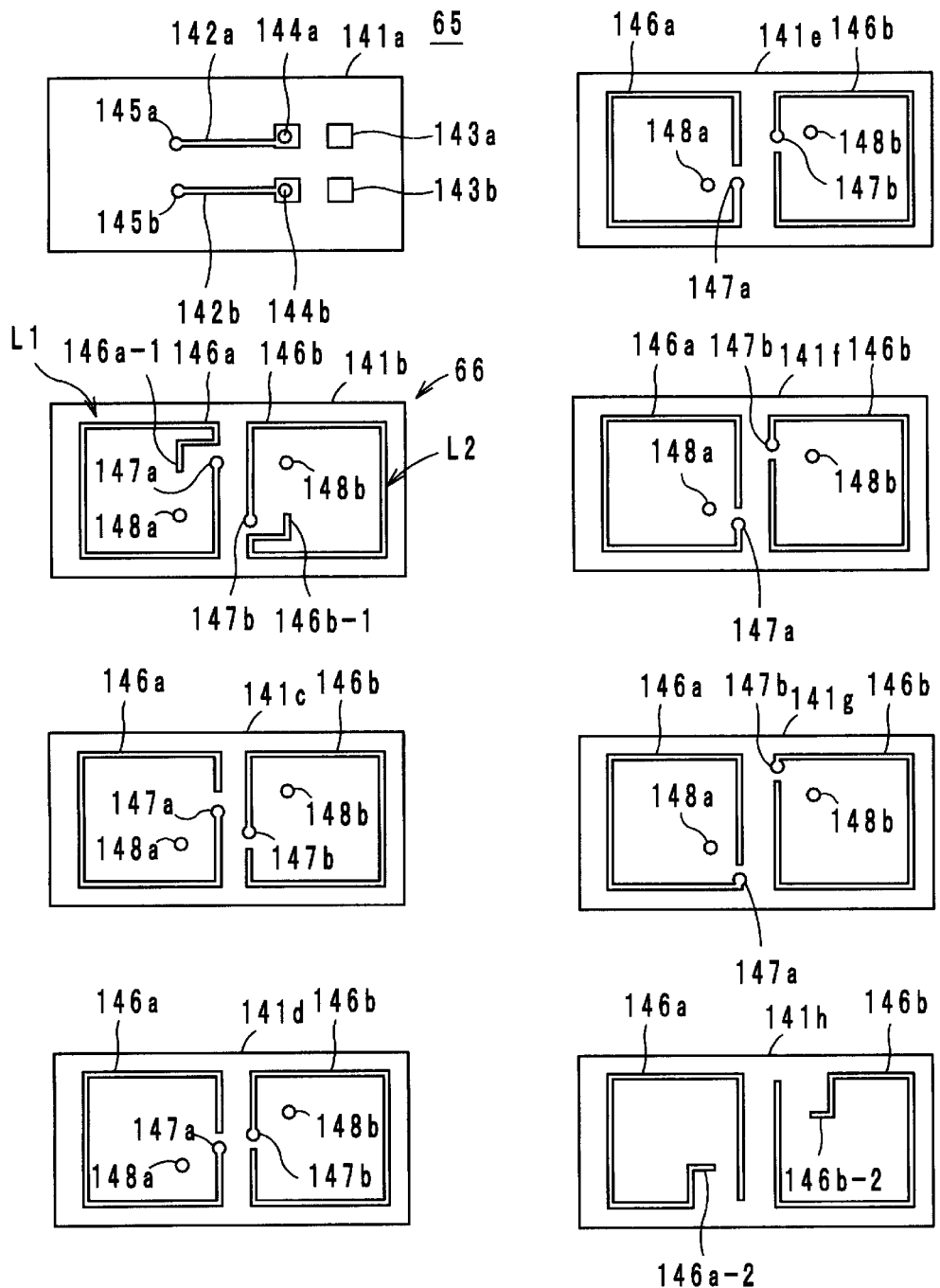
FIG. 8 is a plan view illustrating a laminated structure of the feeding circuit substrate.

As illustrated in FIG. 8, the feeding circuit substrate includes ceramic sheets 141a to 141h made of a dielectric material or a magnetic material and subjected to lamination, pressure-bonding, and firing. However, insulating layers defining the feeding circuit substrate 65 are not limited to the ceramic sheets, and may be resin sheets made of a thermosetting resin or a thermoplastic resin, such as a liquid crystal polymer, for example. The sheet 141a defining the uppermost layer is provided with the feeding terminal electrodes 142a and 142b, the mounting terminal electrodes 143a and 143b, and via-hole conductors 144a, 144b, 145a, and 145b. Each of the sheets 141b to 141h defining the second to eighth layers is provided with wiring electrodes 146a and 146b defining the inductance elements L1 and L2, and is provided, as necessary, with via-hole conductors 147a, 147b, 148a, and 148b.

With the above-described sheets 141a to 141h laminated, the inductance element L1 is provided with the wiring electrode 146a helically connected by the via-hole conductor 147a, and the inductance element L2 is provided with the wiring electrode 146b helically connected by the via-hole conductor 147b. Further, line capacitance is provided between the wiring electrodes 146a and 146b.

An end portion 146a-1 of the wiring electrode 146a on the sheet 141b is connected to the feeding terminal electrode 142a via the via-hole conductor 145a, and an end portion 146a-2 of the wiring electrode 146a on the sheet 141h is connected to the feeding terminal electrode 142b via the via-hole conductors 148a and 145b. An end portion 146b-1 of the wiring electrode 146b on the sheet 141b is connected to the feeding terminal electrode 142b via the via-hole conductor 144b, and an end portion 146b-2 of the wiring electrode 146b on the sheet 141h is connected to the feeding terminal electrode 142a via the via-hole conductors 148b and 144a.

In the above-described feeding circuit 66, the inductance elements L1 and L2 are wound in opposite directions, and thus magnetic fields generated in the inductance elements L1 and L2 are offset. Since the magnetic fields are offset, the wiring electrodes 146a and 146b need to be extended by a certain length to obtain a desired inductance value. Accordingly, the Q value is reduced, and therefore the sharpness of a resonance characteristic is lost, and the bandwidth is increased near the resonant frequency.

In a plan perspective view of the feeding circuit substrate 65, the inductance elements L1 and L2 are provided at laterally different positions. Further, the magnetic fields generated in the inductance elements L1 and L2 have opposite directions. When the feeding circuit 66 is coupled to the feeding circuit 20, therefore, currents in opposite directions are excited in the feeding circuit 20, and it is possible to generate currents in the first and second radiators 41 and 42, and to operate the first and second radiators 41 and 42 as antennas with a potential difference due to the currents.

With the feeding circuit substrate 65 including the resonant/matching circuit built therein, it is possible to prevent a change in characteristics due to the influence of an external article, and to prevent degradation of the communication quality. Further, if the wireless IC chip 51 defining the wireless IC element 50 is disposed toward the center in the thickness direction of the feeding circuit substrate 65, it is possible to prevent the wireless IC chip 51 from being destroyed, and to improve the mechanical strength of the wireless IC element 50.

Second Preferred Embodiment

Figure 9:
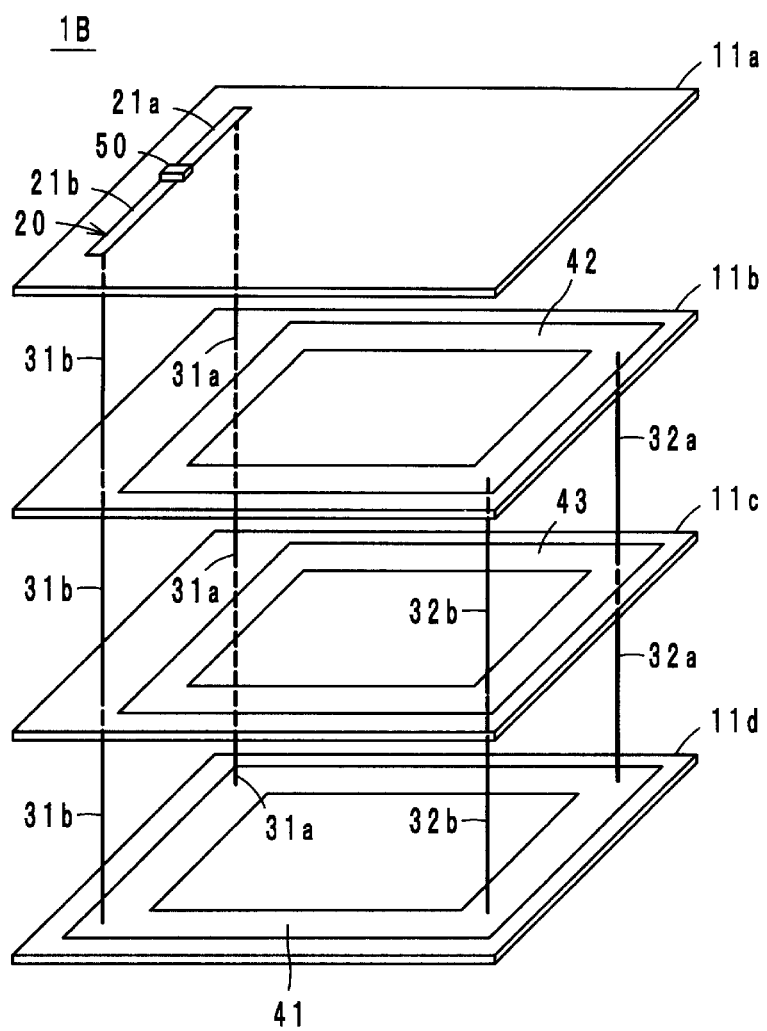
FIG. 9 is an exploded perspective view illustrating a wireless IC device according to a second preferred embodiment of the present invention.

As illustrated in FIG. 9, in a wireless IC device IB according to a second preferred embodiment of the present invention, the first radiator 41 is provided on the base layer 11d, and the second radiator 42 is provided on the base layer 11b. Further, a third radiator 43 is provided on the base layer 11c. Each of the radiators 41, 42, and 43 preferably is loop-shaped in a plan view. The configuration of the feeding circuit 20 is preferably the same as that of the first preferred embodiment, for example. The radiators 41, 42, and 43 are direct-current-coupled by the second interlayer conductors 32a and 32b in respective other side portions thereof.

The operational or functional effect of the wireless IC device 1B according to the second preferred embodiment of the present invention is basically similar to that of the first preferred embodiment of the present invention. With each of the radiators 41, 42, and 43 arranged into a loop shape in a plan view, a magnetic field is also generated along the inside of a loop-shaped pattern, and the radiation gain is further improved.

Third Preferred Embodiment

Figure 10:
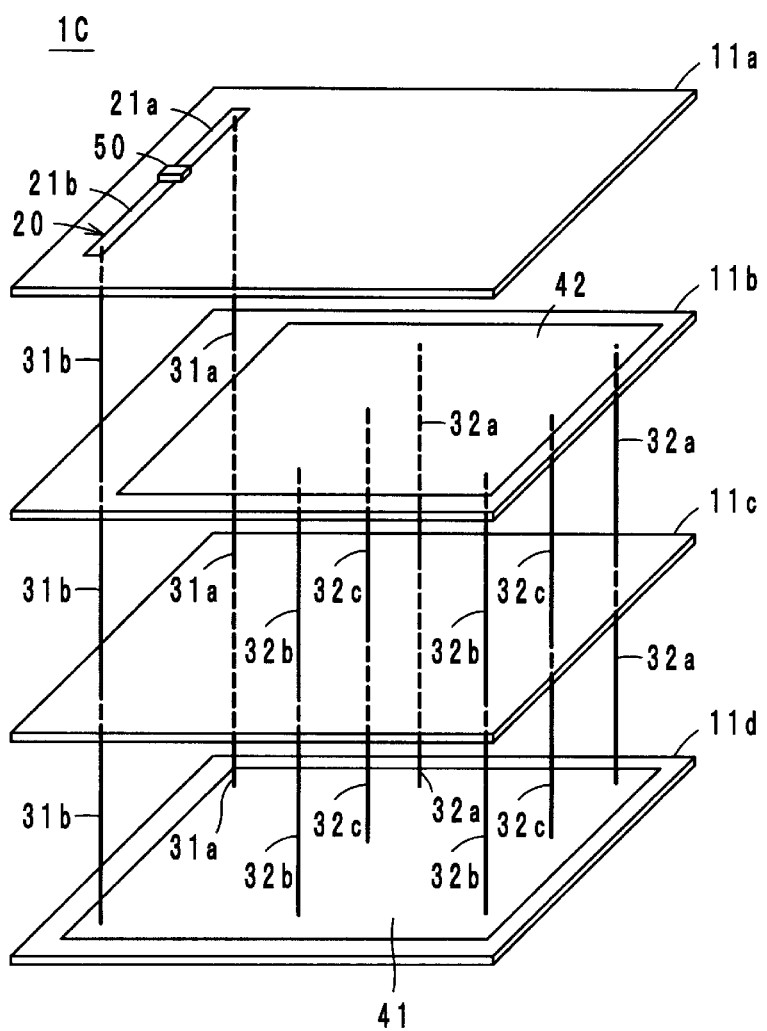
FIG. 10 is an exploded perspective view illustrating a wireless IC device according to a third preferred embodiment of the present invention.

As illustrated in FIG. 10, in a wireless IC device 1C according to a third preferred embodiment of the present invention, the second radiator 42 is solidly provided in a large area on the base layer 11b, and this second radiator 42 and the first radiator 41 are direct-current-coupled by a multitude of second interlayer conductors 32a, 32b, and 32c. The third preferred embodiment of the present invention is similar to the first preferred embodiment of the present invention in the other configurations, and is also basically similar to the first preferred embodiment of the present invention in the operational or functional effect.

Particularly, if the second radiator 42 is solidly provided and connected to the first radiator 41 by the plurality of second interlayer conductors 32a, 32b, and 32c, as in the present third preferred embodiment of the present invention, the grounding function is reinforced. Further, in a side view, the first and second radiators 41 and 42 are configured to define a loop-shaped pattern with the second interlayer conductors 32a, 32b, and 32c. Therefore, a magnetic field is easily generated, and the radiation gain is improved.

Fourth Preferred Embodiment

Figure 11:
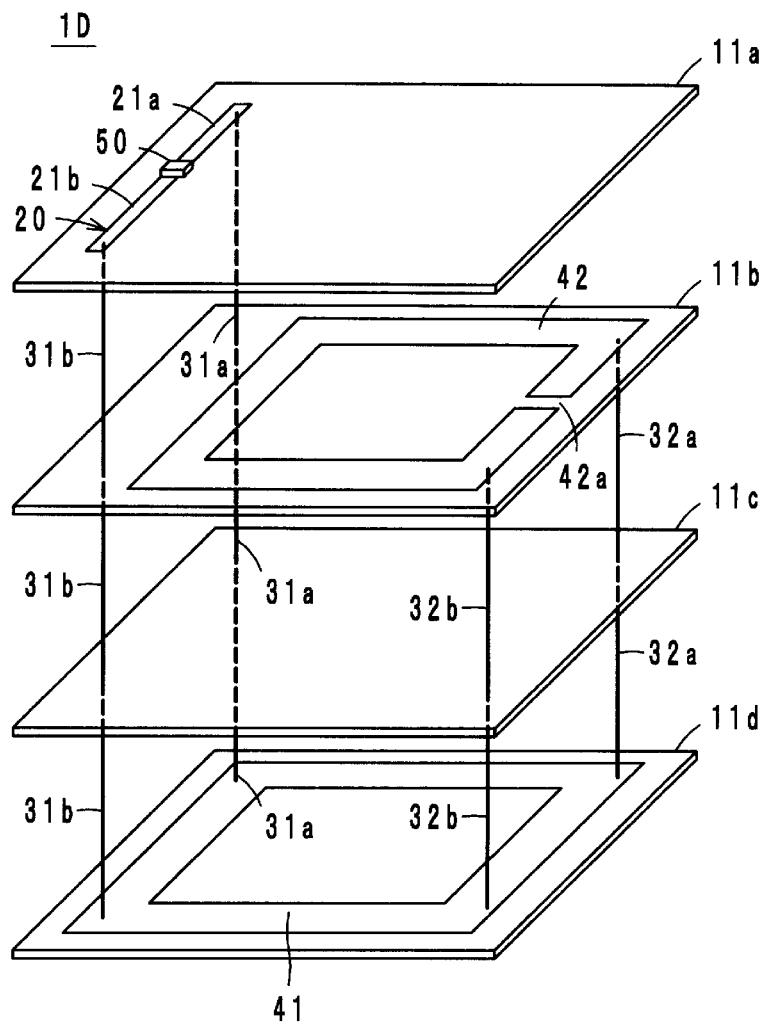
FIG. 11 is an exploded perspective view illustrating a wireless IC device according to a fourth preferred embodiment of the present invention.

As illustrated in FIG. 11, in a wireless IC device 1D according to a fourth preferred embodiment of the present invention, a slit 42a is formed in a portion of the loop-shaped second radiator 42 provided on the base layer 11b, preferably a portion spaced away from the feeding circuit 20.

The fourth preferred embodiment of the present invention is similar to the first preferred embodiment of the present invention in the other configurations, and is also basically similar to the first preferred embodiment of the present invention in the operational or functional effect. Particularly, with the slit 42a located in the second radiator 42, an induced current flows around the slit 42a, and thus the current path of the second radiator 42 is practically extended. In other words, it is possible to reduce the size of the second radiator 42. The first radiator 41 may also be provided with a slit.

Fifth Preferred Embodiment

Figure 12A:
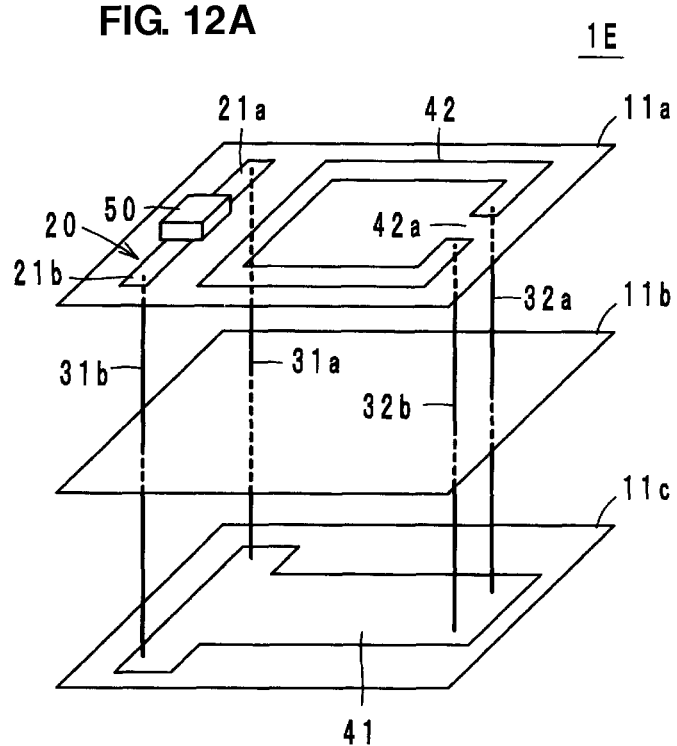

As illustrated in FIG. 12A, in a wireless IC device IE according to a fifth preferred embodiment of the present invention, the second radiator 42 is provided on the base layer 11a to be adjacent to the feeding conductors 21a and 21b defining the feeding circuit 20, and the first radiator 41 is provided on the base layer 11c laminated via the base layer 11b. The first radiator 41 preferably is substantially T-shaped, and is formed in a solid state.

Respective end portions of the feeding conductors 21a and 21b are direct-current-coupled to opposite side portions of one end of the first radiator 41 via the first interlayer conductors 31a and 31b passing through the base layer 11b. The second radiator 42 defines a loop shape including the slit 42a, and portions of the second radiator 42 facing the slit 42a are direct-current-coupled to other end portions of the first radiator 41 via the second interlayer conductors 32a and 32b passing through the base layer 11b.

Figure 12B:
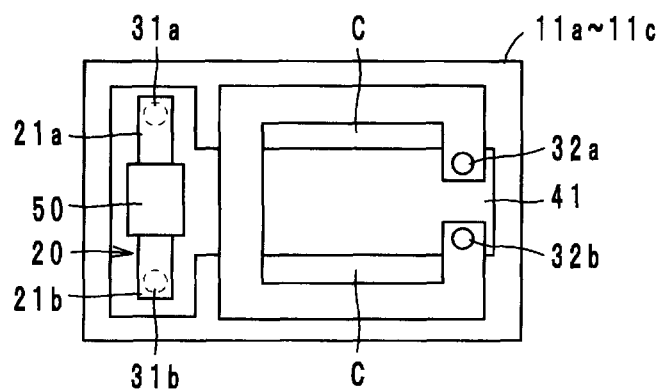

The operational or functional effects of the fifth preferred embodiment of the present invention are basically similar to that of the first and fourth preferred embodiments of the present invention. Particularly, due to the provision of regions C in which the first and second radiators 41 and 42 do not overlap each other in a plan view, as illustrated in FIG. 12B, a magnetic flux defined by the second radiator 42 is less likely to be blocked by the first radiator 41, and the radiation characteristic of the second radiator 42 is improved. That is, the radiation gain toward the first main surface (the upper surface of the wireless IC device 1E) is increased.

Sixth Preferred Embodiment

Figure 13:
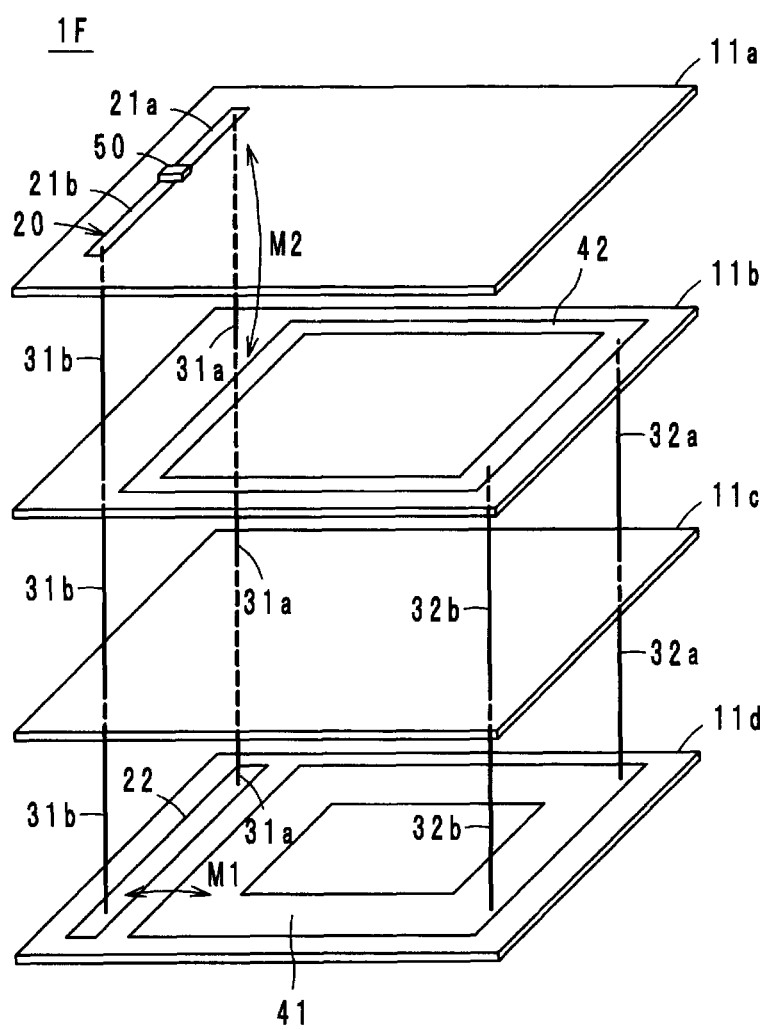
FIG. 13 is an exploded perspective view illustrating a wireless IC device according to a sixth preferred embodiment of the present invention.

As illustrated in FIG. 13, a wireless IC device 1F according to a sixth preferred embodiment of the present invention includes a feeding conductor 22 preferably located on the base layer 11d at the same position as the position of the feeding conductors 21a and 21b in a plan view. This feeding conductor 22 is connected to the feeding conductors 21a and 21b via the first interlayer conductors 31a and 31b. The first radiator 41 is provided on the base layer 11d to be proximate to the feeding conductor 22. Further, the second radiator 42 is provided on the base layer 11b, and is connected to the first radiator 41 via the second interlayer conductors 32a and 32b.

In the present sixth preferred embodiment of the present invention, the feeding circuit 20 includes the feeding conductors 21a, 21b, and 22 and the first interlayer conductors 31a and 31b, and is coupled to the first radiator 41 only by electromagnetic field coupling (M1). The operational or functional effects of the sixth preferred embodiment of the present invention are basically similar to that of the first preferred embodiment of the present invention. In the sixth preferred embodiment of the present invention, the first and second radiators 41 and 42 are coupled to the feeding circuit 20 preferably only by electromagnetic field coupling M1 and electromagnetic field coupling M2, respectively, and are not direct-current-connected to the feeding circuit 20. Even if a surge voltage is applied to the first and second radiators 41 and 42, therefore, it is possible to prevent the surge voltage from being applied to the wireless IC element 50.

Seventh Preferred Embodiment

Figure 14:
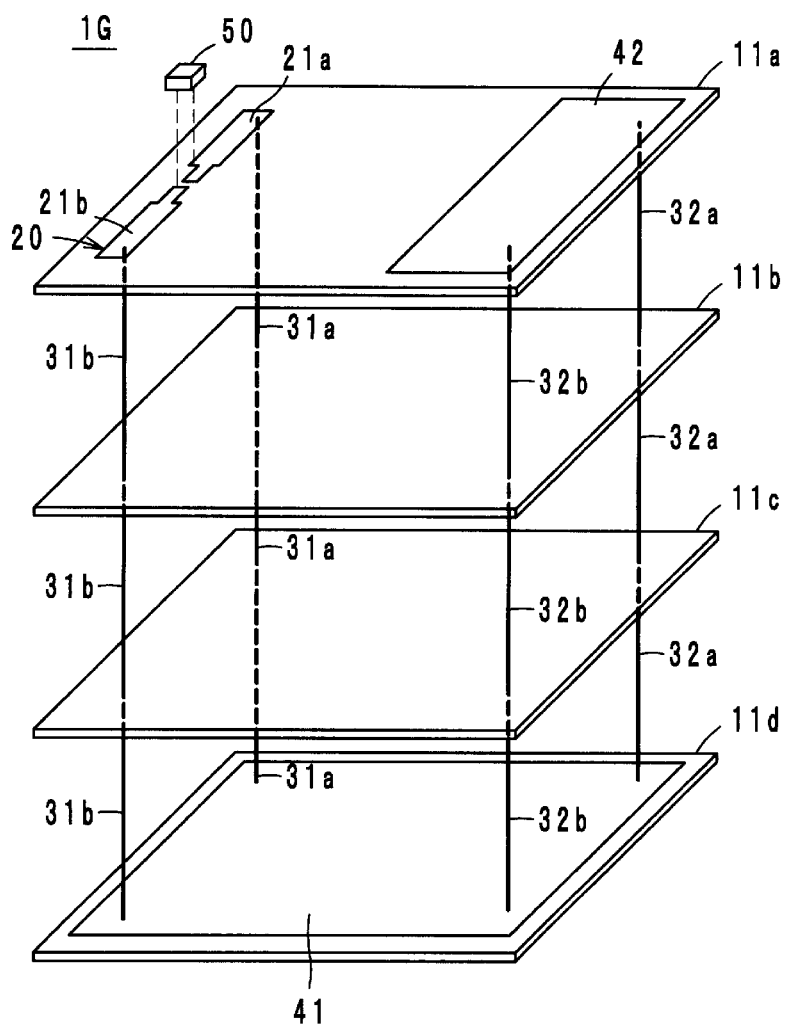
FIG. 14 is an exploded perspective view illustrating a wireless IC device according to a seventh preferred embodiment of the present invention.
Figure 15:
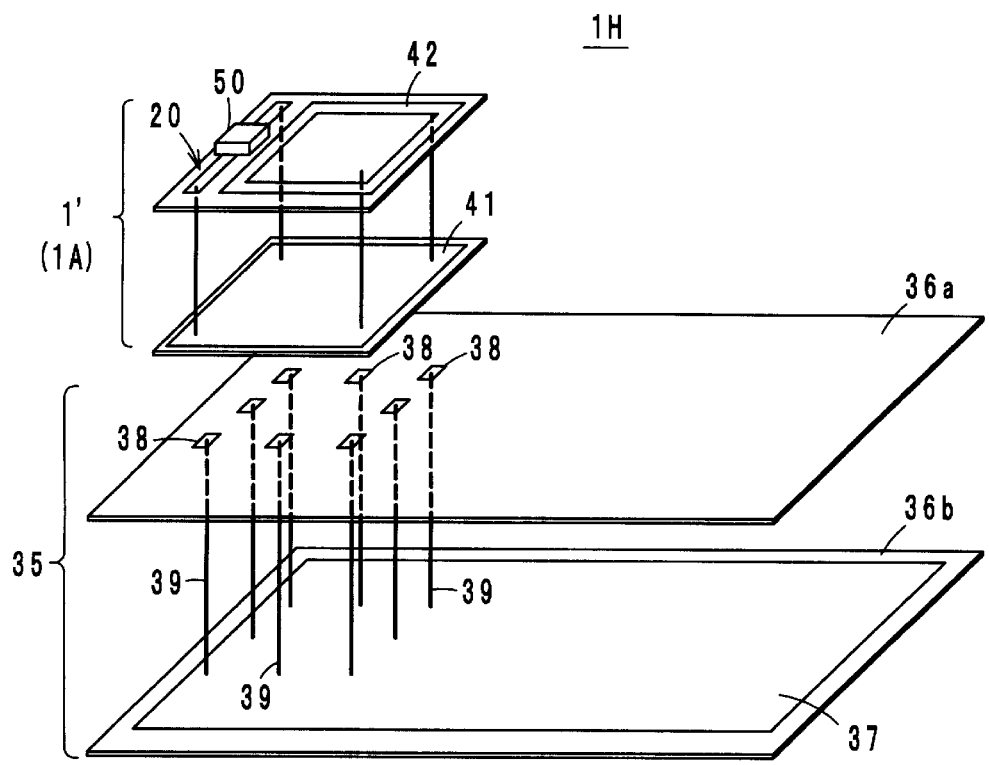
FIG. 15 is an exploded perspective view illustrating a wireless IC device according to an eighth preferred embodiment of the present invention.

As illustrated in FIG. 14, in a wireless IC device 1G according to a seventh preferred embodiment of the present invention, the second radiator 42 is preferably disposed on another side of the base layer 11a away from the feeding conductors 21a and 21b. The seventh preferred embodiment of the present invention is similar to the first preferred embodiment of the present invention in the other configurations. The second radiator 42 is coupled to the feeding circuit 20 via the second interlayer conductors 32a and 32b and the first radiator 41, and produces operational or functional effects similar to that of the first preferred embodiment of the present invention.

Eighth Preferred Embodiment

A wireless IC device 1H according to an eighth preferred embodiment of the present invention includes a parent substrate 35 and a child substrate 1' mounted on the parent substrate 35. The child substrate 1' is the same as the wireless IC device 1A according to the first preferred embodiment of the present invention, and may be one of the wireless IC devices 1B to 1G described as the other preferred embodiment examples. The parent substrate 35 is a multilayer substrate that is preferably formed by lamination of base layers 36a and 36b, in which a radiator 37 is located on the base layer 36b and a plurality of terminal electrodes 38 are located on the base layer 36a. The base layers 36a and 36b are made of a material similar to that of the base layers 11a to 11d. The radiator 37 functions as an antenna element, as described below, and may function as a ground electrode of electronic components mounted on the parent substrate 35 and the child substrate 1' (see FIG. 17).

Figure 16:
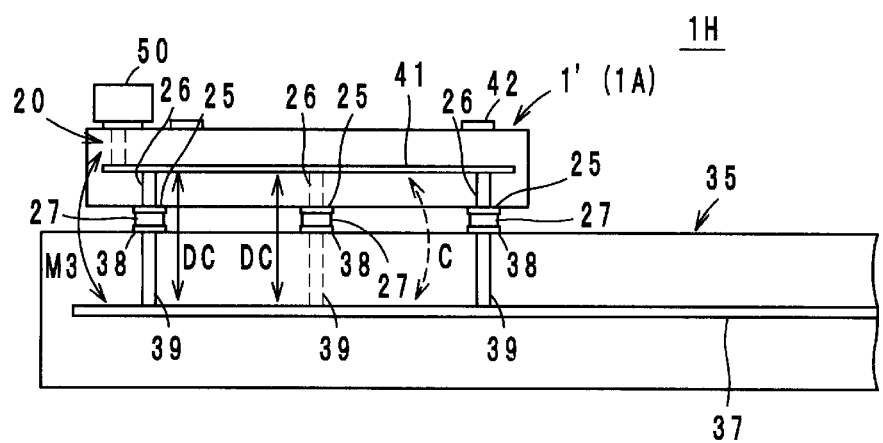
FIG. 16 is an explanatory diagram illustrating a coupling relationship of radiators in the wireless IC device according to the eighth preferred embodiment of the present invention.

As illustrated in FIG. 16, a plurality of terminal electrodes 25 are located on the lower surface of the child substrate 1', and are electrically connected to the first radiator 41 via interlayer conductors (via-hole conductors) 26. The terminal electrodes 38 located on the parent substrate 35 are electrically connected to the radiator 37 via interlayer conductors (via-hole conductors) 39. Further, the child substrate 1' includes the terminal electrodes 25 electrically connected to and fixed on the terminal electrodes 38 by joining members 27, such as solder or conductive pins.

The radiator 37 preferably is electromagnetic field coupled (M3) to the loop-shaped feeding circuit 20, and preferably is direct-current-coupled to the first radiator 41. The operation of the child substrate 1' is as described in the first preferred embodiment of the present invention. A high-frequency signal is transmitted between the first radiator 41 and the radiator 37. In the eighth preferred embodiment of the present invention, in addition to the first and second radiators 41 and 42, the radiator 37 of the parent substrate 35 also functions as an antenna element. Therefore, the overall area of the radiators is increased, and the radiation gain is improved. Further, the single wireless IC element 50 is capable of managing both the information of the child substrate 1' and the information of the parent substrate 35, and the wireless IC device 50 is not required to be provided in plurality. Further, it is possible to efficiently transmit and radiate the heat of the child substrate 1' having a small area to the parent substrate 35 having a large area via the interlayer conductors 26 and the joining members 27 such as solder.

The first radiator 41 and the radiator 37 of the parent substrate are not necessarily required to be direct-current-coupled, and may be electromagnetic field coupled mainly via capacitance C, for example.

Figure 17:
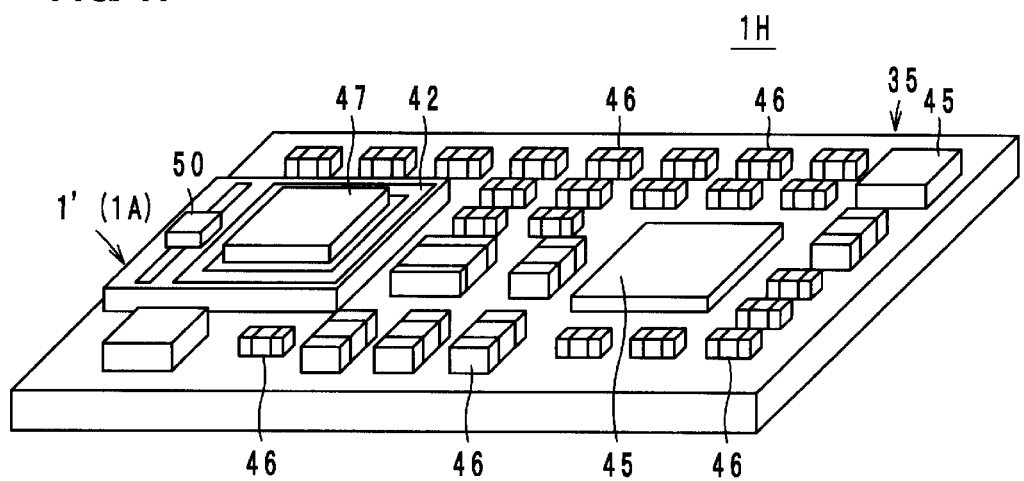
FIG. 17 is a perspective view illustrating a state in which various electronic components are mounted on the wireless IC device according to the eighth preferred embodiment of the present invention.

The wireless IC device 1H preferably includes various electronic components mounted thereon, and is built in an electronic device, such as a computer. Such an example is illustrated in FIG. 17. The parent substrate 35 includes a multitude of components, such as IC circuit components 45 and chip-type electronic components 46, mounted thereon. Further, the child substrate 1' also includes an IC circuit component 47 mounted thereon.

Other Preferred Embodiments

The wireless IC device according to the present invention is not limited to the preferred embodiments described above, and may be variously modified within the scope of the present invention. For example, the first main surface of the multilayer substrate may include a cavity, and the wireless IC element may be housed in the cavity, partially or completely, for example.

As described above, preferred embodiments of the present invention are superior in improving the radiation gain without increasing substrate size and easily adjusting the impedance.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless IC device comprising:
    a substrate including a first main surface and a second main surface facing the first main surface;
    a wireless IC element provided on a side of the first main surface and arranged to process a high-frequency signal;
    a first radiator including first and second ends, provided on a side of the second main surface, and coupled to the wireless IC element via a feeding circuit including a first interlayer conductor; and a second radiator including first and second ends, provided on the side of the first main surface, and coupled to the first radiator via a second interlayer conductor; wherein the wireless IC element is connected to the first end of the first radiator;

the first end of the second radiator is connected to the second end of the first radiator; and the second end of the second radiator is not connected to the wireless IC element such that the second radiator is open.

2. The wireless IC device described in claim 1, wherein the feeding circuit is loop-shaped, and the loop-shaped feeding circuit is coupled to the first radiator via a direct current or via an electromagnetic field.

3. The wireless IC device described in claim 2, wherein the loop-shaped feeding circuit is coupled to the second radiator via an electromagnetic field.

4. The wireless IC device described in claim 2, wherein the loop-shaped feeding circuit includes a loop surface that is perpendicular or substantially perpendicular to the first radiator and the second radiator.

5. The wireless IC device described in claim 2, wherein the substrate is a child substrate mounted on a parent substrate, and the parent substrate is provided with an additional radiator coupled to the loop-shaped feeding circuit via an electromagnetic field.

6. The wireless IC device described in claim 1, wherein at least one of the first radiator and the second radiator is loop-shaped.

7. The wireless IC device described in claim 6, wherein at least one of the first radiator and the second radiator includes a portion including a slit.

8. The wireless IC device described in claim 1, wherein the first radiator has a solid configuration, and the second radiator is configured in a loop shape, and an area inside a loop of the second radiator includes a region in which the first radiator and the second radiator do not overlap each other in a plan view.

9. The wireless IC device described in claim 1, wherein a first ground electrode provided on the side of the second main surface of the substrate defines the first radiator, and a second ground electrode provided on the side of the first main surface of the substrate defines the second radiator.

10. The wireless IC device described in claim 1, wherein the wireless IC element is a wireless IC chip arranged to process a high-frequency signal.

11. The wireless IC device described in claim 1, wherein the wireless IC element includes a wireless IC chip arranged to process a high-frequency signal and a feeding circuit substrate which includes a feeding circuit having a predetermined resonant frequency.

12. The wireless IC device described in claim 1, wherein the first and second radiators define antennas or ground electrodes of electronic components.

13. The wireless IC device described in claim 1, wherein the substrate is a multilayer substrate including base layers laminated on each other;

the first radiator is provided on a first of the base layers;

the second radiator is provided on a second of the base layers;

a third radiator is provided on a third of the base layers;

the first, second and third radiators are loop-shaped and direct-current-coupled to each other.

14. The wireless IC device described in claim 1, wherein the second radiator has a solid configuration, and the second radiator and the first radiator are direct-current-coupled by a plurality of the second interlayer conductors.

15. The wireless IC device described in claim 1, wherein the second radiator is loop-shaped and includes a slit provided in a portion spaced away from the feeding circuit.

16. The wireless IC device described in claim 1, wherein the substrate is a multilayer substrate including base layers laminated on each other;

the first radiator is provided on a first of the base layers;

the second radiator is provided on a second of the base layers located adjacent to feeding conductors of the feeding circuit;

a third of the base layers is laminated between the first of the base layers and the second of the base layers;

end portions of the feeding conductors are direct-current-coupled to opposite side portions of first end portions of the first radiator via the first interlayer conductor; and the second radiator is loop-shaped and includes a slit, and portions of the second radiator facing the slit are direct-current-coupled to second end portions of the first radiator via the second interlayer conductor.

17. The wireless IC device described in claim 1, wherein the feeding circuit includes the first interlayer conductor and first, second and third feeding conductors located adjacent to each other in plan view and connected to each other via the first interlayer conductor; and the feeding circuit is coupled to the first radiator only by electromagnetic field coupling.

18. The wireless IC device described in claim 1, wherein the second radiator is spaced away from first and second feeding conductors of the feeding circuit and the second radiator is coupled to the feeding circuit via the second interlayer conductor and the first radiator.

19. The wireless IC device described in claim 1, wherein the first main surface of the substrate includes a cavity, and the wireless IC element is located in the cavity partially or completely.

20. A radio frequency identification system comprising the wireless IC device according to claim 1.

* * * * *